(12) United States Patent
Sun

(10) Patent No.: US 6,242,296 B1
(45) Date of Patent: Jun. 5, 2001

(54) METHOD OF FABRICATING EMBEDDED DRAM

(75) Inventor: Shih-Wei Sun, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/212,732

(22) Filed: Dec. 15, 1998

(51) Int. Cl.$^7$ .................. H01L 21/8234; H01L 21/8244
(52) U.S. Cl. ....................... 438/238; 438/239; 438/253
(58) Field of Search .................................. 438/238, 239, 438/253

(56) References Cited

U.S. PATENT DOCUMENTS

| 5,248,627 | * | 9/1993 | Williams | 438/268 |
| 5,296,399 | * | 3/1994 | Park | 438/241 |
| 5,930,618 | * | 7/1999 | Sun et al. | 438/240 |

* cited by examiner

Primary Examiner—Richard Elms
Assistant Examiner—Christian D. Wilson
(74) Attorney, Agent, or Firm—Oppenheimer Wolff & Donnelly, LLP

(57) ABSTRACT

A method of fabricating an embedded DRAM. A word line and a gate are formed in a memory region and a logic circuitry region on the substrate. An etching stop layer is formed over the substrate and a cell array of the memory region is fabricated within a dielectric layer. Using the etching stop layer as a stop point, the dielectric layer in the logic circuitry region is removed. The etching stop layer in the logic circuitry region is removed to expose the gate and the substrate. A high-energy threshold adjust implantation is performed through the gate to form a retrograde channel profile in the substrate. A source/drain region is formed in the substrate beside the gate in the logic circuitry region and a salicide is formed on the source/drain region.

12 Claims, 4 Drawing Sheets

METHOD OF FABRICATING EMBEDDED DRAM

BACKGROUND OF THE INVENTION

1. Field of the Invention

The invention relates to a method of fabricating an integrated circuit, and more particularly to a method of fabricating an embedded dynamic random access memory (embedded DRAM).

2. Description of the Related Art

In the general fabricating process of embedded DRAM, in order to enhance the conductivity and reduce the contact resistance of source/drain region of the transistor in the logic circuitry region, a salicide is formed on the source/drain region of the substrate by self-aligned silicide process. The process to fabricate the bit line and the capacitor are then performed in the memory region when the salicide and the doped region are already formed in the logic circuitry region. The major material of the capacitor dielectric layer currently is ONO or $Ta_2O_5$ and it is necessary to perform a high temperature thermal process to form the capacitor dielectric layer. However, the high temperature thermal process causes diffusion of ions in the doped region of the logic circuitry region. When the size of the device is gradually reduced, the short channel effect and punch through are easily occurred in the substrate due to the diffusion of the doped region and as a result, the reliability of the devices is degraded.

In addition, the high temperature process causes the agglomeration of the salicide and its volume is therefore reduced when the thermal process is performed after the formation of the salicide. The resistance of the salicide is hence increased to lower the performance of the salicide since agglomeration.

SUMMARY OF THE INVENTION

It is therefore an object of the invention to provide a method of fabricating an embedded DRAM. The thermal process for the formation of the capacitor is prior to the formation of the doped region in the logic circuitry region to prevent diffusion occurred seriously in the doped region, and the reliability of device can be thus enhanced.

It is therefore an object of the invention to provide a method of fabricating an embedded DRAM. The thermal process for the formation of the capacitor is prior to the formation of the salicide to lower the probability that the agglomeration of the salicide is occurred, and the conductivity of the salicide can be improved.

To achieve these objects and advantages, and in accordance with the purpose of the invention, as embodied and broadly described herein, the invention is directed towards a method of fabricating an embedded DRAM. A word line and a gate are formed in a memory region and a logic circuitry region on the substrate. An etching stop layer is formed over the substrate and an array memory of the memory region is fabricated within a dielectric layer covered the etching stop layer. Using the etching stop layer as a stop point, the dielectric layer in the logic circuitry region is removed. The etching stop layer in the logic circuitry region is then removed to expose the gate and the substrate. A high-energy threshold adjust implantation is performed through the gate to form a retrograde channel profile. A source/drain region is formed in the substrate beside the gate in the logic circuitry region and a salicide is formed on the source/drain region.

It is to be understood that both the foregoing general description and the following detailed description are exemplary and explanatory only and are not restrictive of the invention, as claimed.

DESCRIPTION OF THE PREFERRED EMBODIMENTS

The fabrication of the doped region and the salicide within the substrate of the logic circuitry region is normally prior to the formation of the capacitor in the memory region in the embedded DRAM process of prior art. With respect to the thermal process for forming the capacitor dielectric layer, the doped region is spread out since diffusion of the ions in the doped region, and it also causes the resistance of the salicide increased due to the agglomeration of the salicide. Therefore, a fabricating method of an embedded DRAM is provided in the invention. A capacitor in the memory region is formed prior to the fabrication of the doped region and the salicide in the logic circuitry region to prevent short channel effect and punch through occurred in the substrate and the resistance of the salicide can be reduced.

FIGS. 1A–1E shows fabrication of an embedded DRAM in a preferred embodiment according to this invention.

Figure 1A:
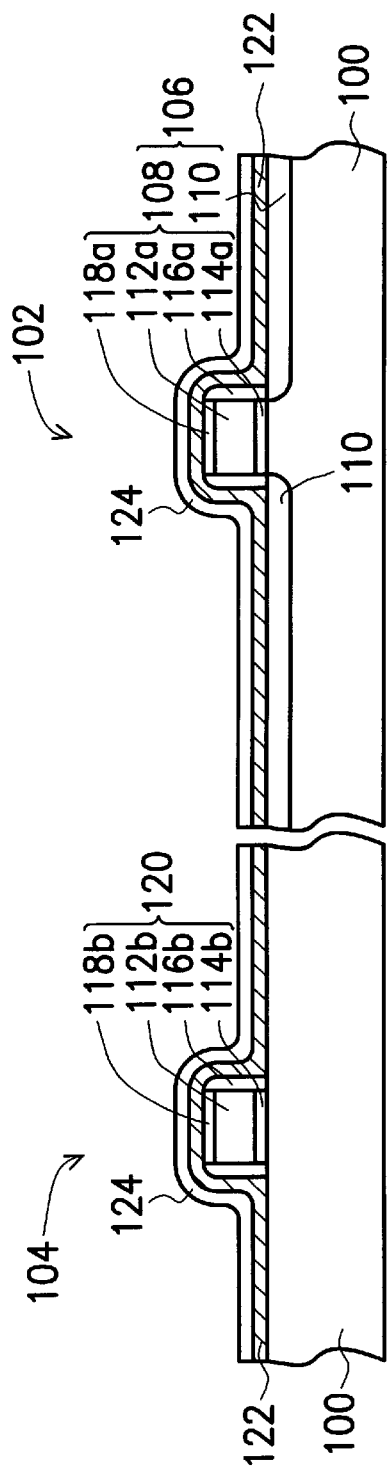
FIGS. 1A–1E are schematic, cross sectional view illustrating fabrication of an embedded DRAM in a preferred embodiment according to the invention.

Referring to FIG. 1A, a memory region 102 and a logic circuitry region 104 are defined on a P-type substrate 100. A MOS transistor including word line 108 and lightly doped drain region (LDD) is formed in the memory region 102 by the technique well known in prior art. The word line 108 has a conductive layer 112a insulating with the substrate 100 by a gate oxide layer 114a, and a spacer 116a and a cap layer 118a are formed on the sidewall and the top of the conductive layer 112a respectively. The cap layer 118a and the spacer 116a are used to protect the conductive layer 112a.

When the MOS transistor 106 is formed in the memory region 102, an early process to fabricate a CMOS is performed to form a gate 120 in the logic circuitry region 104 simultaneously. The gate 120 includes a conductive layer 112b, and the gate 120 and the substrate 100 are isolated by a gate oxide layer 114b formed on the substrate 100. A spacer 116b is formed on the sidewall of the conductive layer 112b to protect the conductive layer 112b. The conductive layer 112a, 112b includes silicide, tungsten silicide or metal layer and the spacer 116a, 116b is such as silicon nitride.

Referring to FIG. 1A again, a buffer layer 122 is formed on the substrate 100 to cover the MOS transistor 106 in the region 102 and the gate 120 in the logic circuitry region 104. The buffer layer 122 includes a silicon oxide layer. An etching stop layer 124 such as silicon nitride layer is formed on the buffer layer 122.

Figure 1B:
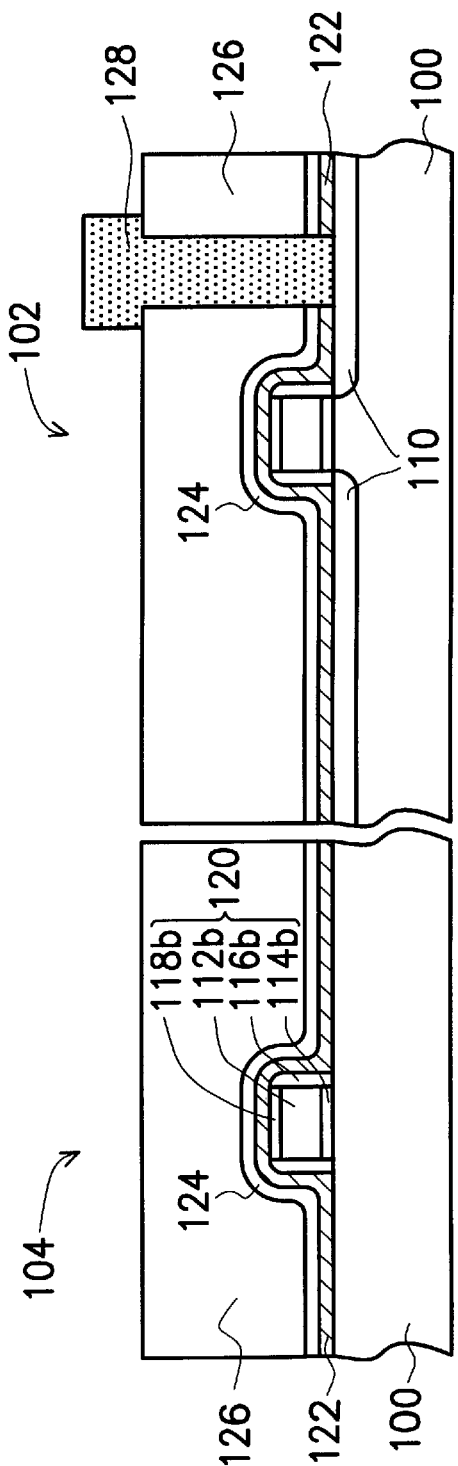

As shown in FIG. 1B, a dielectric layer 126 is then formed on the etching stop layer 124. Subsequently, a cell array including a bit line and a capacitor is formed in the memory region. The dielectric layer 126 is patterned by photolithography to form a contact 128 in the memory region 102 and the contact 128 serving as a bit line is electrically connected to the source/drain region 110 of the MOS transistor 106. The dielectric layer 126 includes BPSG and the contact 128 is formed by conductive material or example, polysilicon, silicide or metal layer.

Figure 1C:
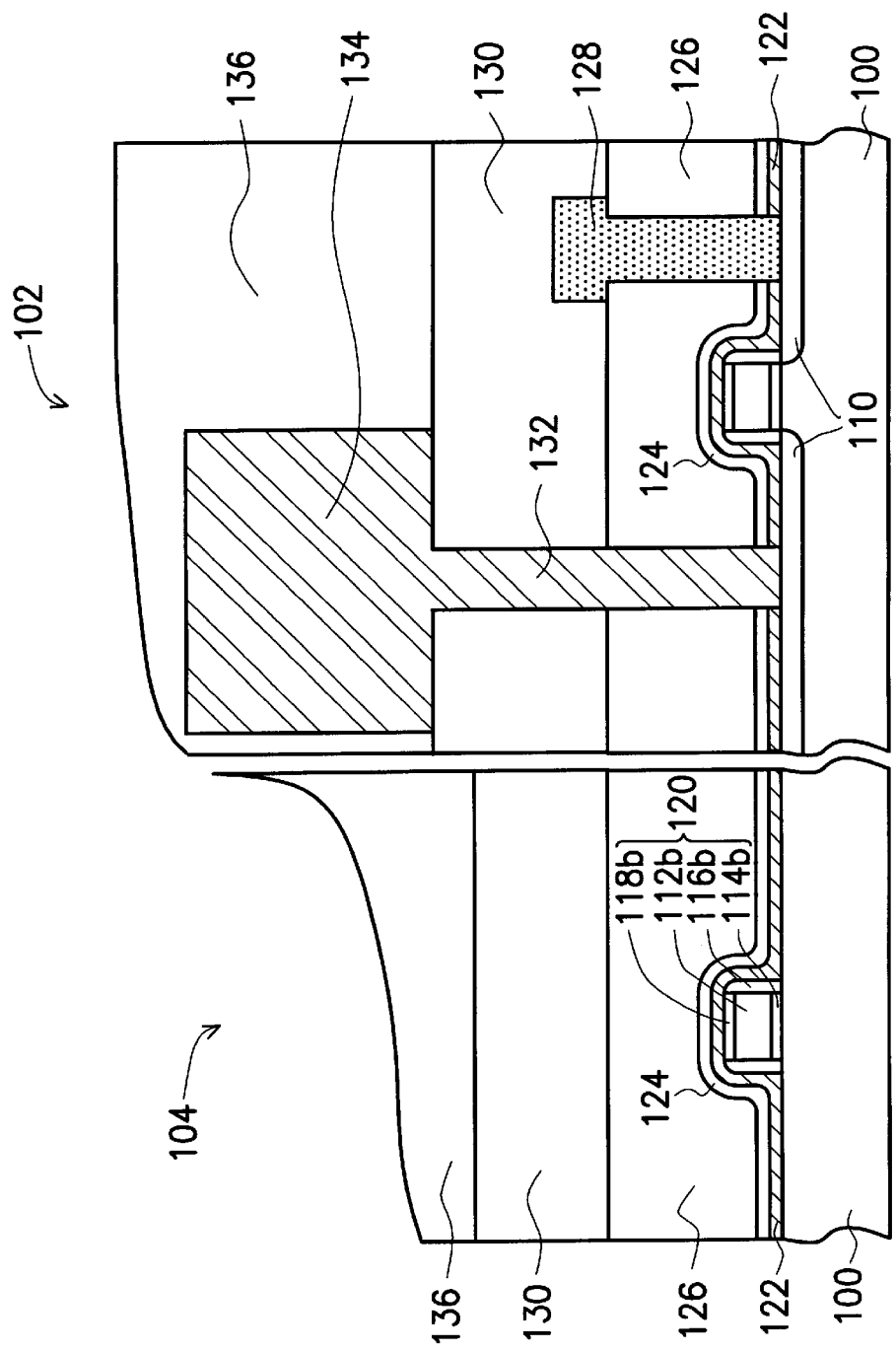

Referring to FIG. 1C, a dielectric layer 130 including silicon oxide layer is formed over the substrate 100 by chemical vapor deposition (CVD). A node contact 132 is formed in the memory region 102 and a capacitor 134 formed subsequently is electrically connected to the source/drain region 110 by the node contact 132. The capacitor 134 is not restricted with a cylinder structure as shown in the FIG. 1C and it can be a fin or a crown structure. A dielectric layer 136 covered the capacitor 134 and the dielectric layer 130 is formed and planarized. The topography of the dielectric layer 136 between the memory region 102 and the logic circuitry region 104 is more even.

Figure 1D:
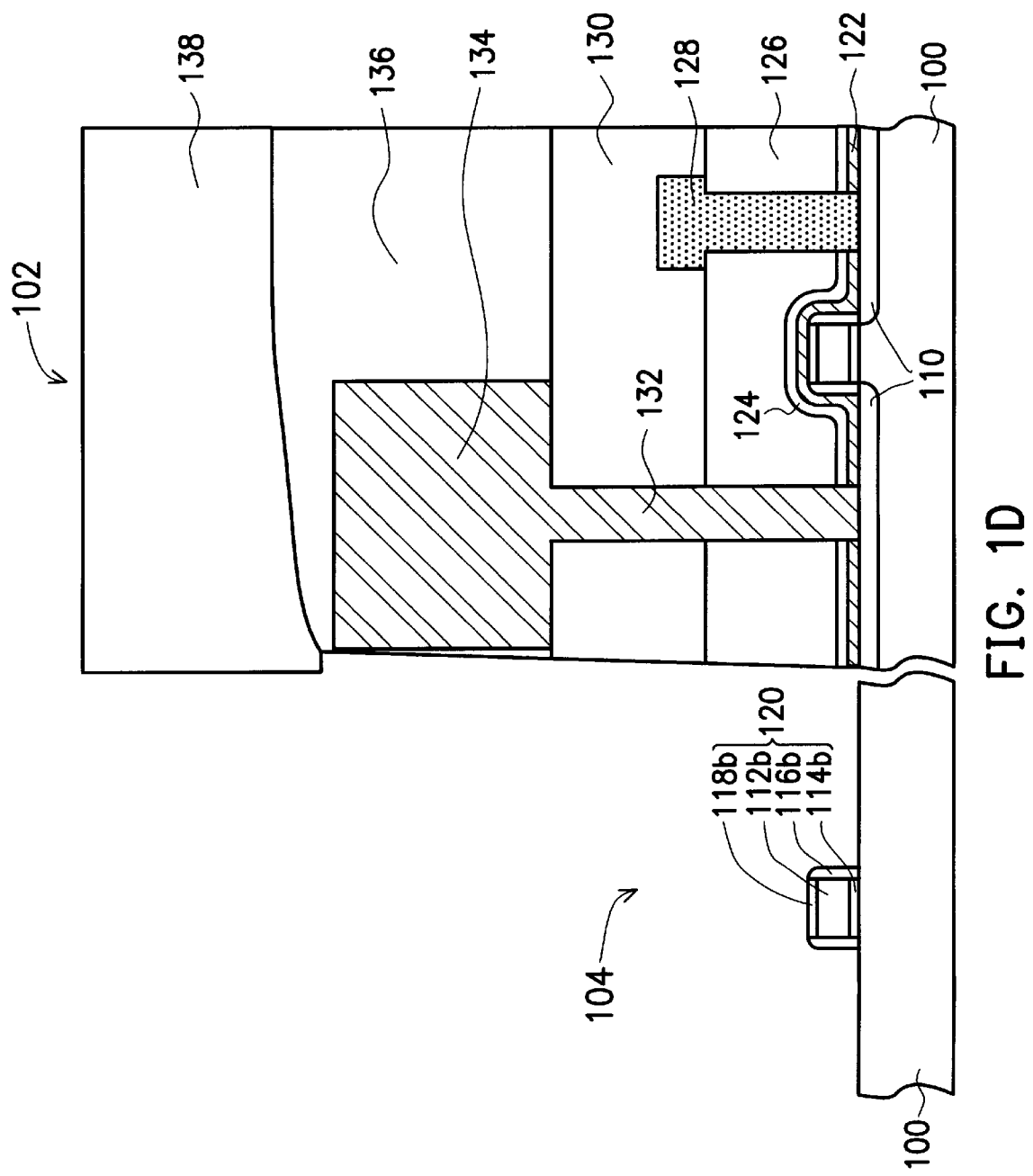

A photoresist layer 138 is then formed on the memory region 102 through coating, patterning and developing, as shown in FIG. 1D. Using the photoresist layer 138 as a mask, the dielectric layers 136, 130, 126 in the logic circuitry region 104 are removed by such as wet etching. Since the etching stop layer 124 covers the logic circuitry region 104, the wet etching process stops on the etching layer 124. The dielectric layers 136, 130 126 can be removed in a HF solution. The etching stop layer 124 on the logic circuitry region 104 is then removed by wet etching. Since the formation of the buffer layer 122 and its material is different from the etching stop layer 124 and the spacer 116b, the spacer 116b can be prevented form being damaged by the wet etching for the etching stop layer 124. The buffer layer 122 is then removed. The material of the buffer layer 122 and the space 1226b are different and the etching rate of the buffer layer 122 is better than the spacer 116b, so that the step to remove the buffer layer 122 can be easily performed to expose the substrate 100 and the gate 120.

Figure 1E:
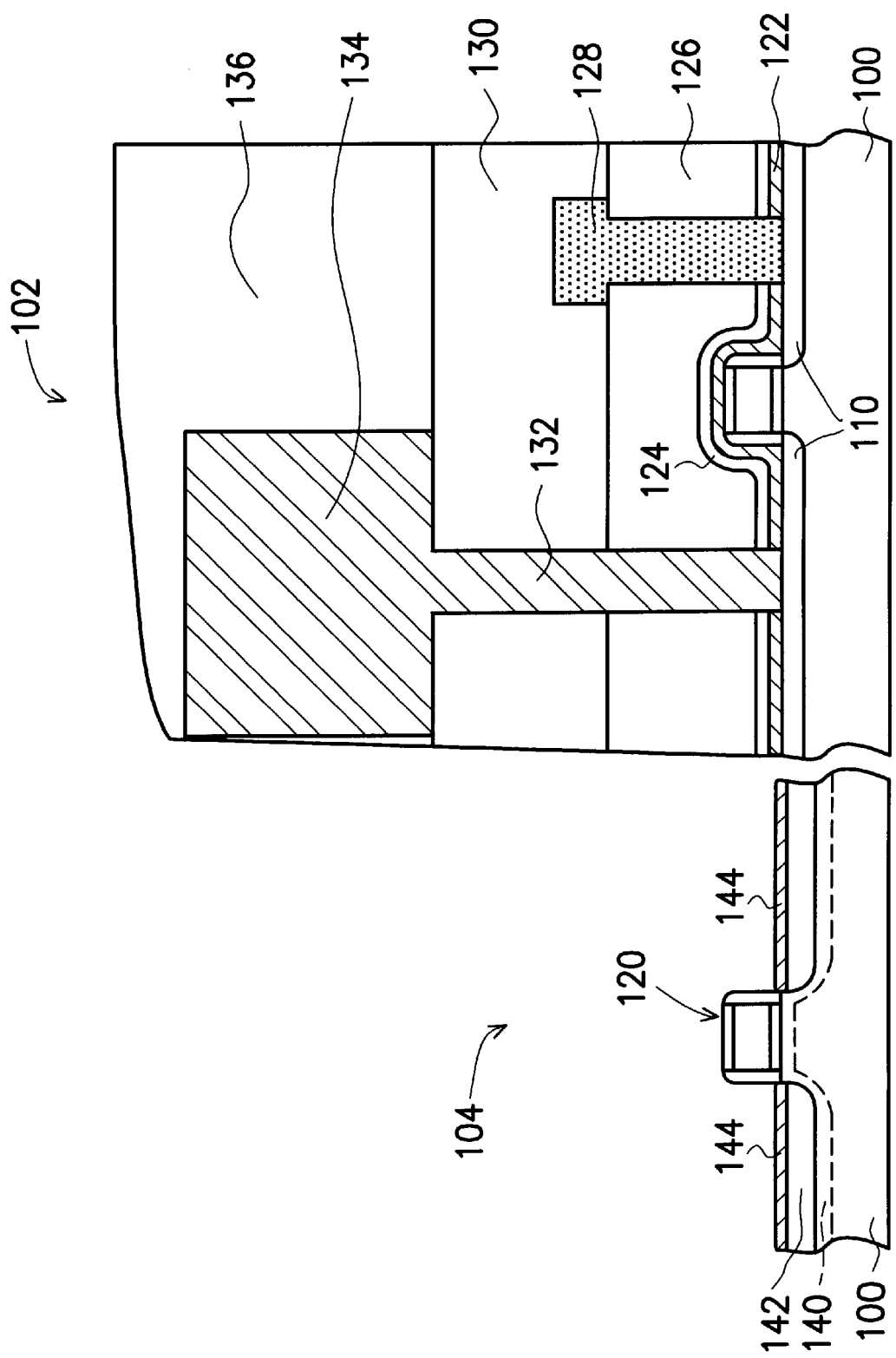

Referring to FIG. 1E, the photoresist layer 138 is stripped. A step of threshold adjust implantation is performed on the logic circuitry region 104 to adjust the threshold voltage of the gate 120. The ion implantation is high-energy through gate implantation and the ions are implanted into the substrate 100 through the gate 120 to form a retrograde channel profile. The dosage of the ion is in a range of about 1.0E12–1.0E14 ions/cm$^2$ and the energy for ion implantation is varied from the thickness of the gate 120 and the ions. A channel implantation 140 within the substrate 100 in the logic circuitry region 104 is performed in the forgoing step and a retrograde channel profile is therefore provided. Since the doped region in the logic circuitry region is fabricated after the formation of the capacitor in the memory region, the ions are not diffused vertically seriously due to heat cycles associated with capacitor formation. The short channel effect and punch through are therefore enhanced. A source/drain region 142 is then formed in the substrate 100 beside the gate 120 in the logic circuitry region 104, and a salicide 144 is formed on the source/drain region 142. The salicide 144 such as titanium silicide is formed from forming a titanium on the substrate 100 and performing a thermal process that the titanium is reacted with the substrate to form a titanium silicide. The salicide 144 is formed after the formation of the capacitor 134 in the memory region 102, the salicide does not agglomerate to cause low resistance due to the thermal process for forming the capacitor dielectric layer.

In addition, the formation of the buffer layer is decided by the material of the spacer, the etching stop layer and the dielectric layer. In the spacer is silicon oxide layer and the etching stop layer is silicon nitride, the buffer layer is not necessary and the spacer is not damaged when the dielectric layers and the etching stop layer in the logic circuitry region are removed by wet etching.

The capacitor can be formed in the memory region prior to the fabrication of the retrograde channel profile, source/drain region and salicide by using an etching stop layer to remove the dielectric layers of the logic circuitry region.

Since the process of threshold adjust implantation, source/drain region and salicide are performed after thermal cycles associated with formation of capacitor, short channel effect and punch through due to spread out of doping profile of the logic circuitry region can be prevented and the agglomeration of salicide due to high temperature can be also enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating an embedded DRAM wherein a memory region and a logic circuitry region are defined on a substrate, comprising:

forming a word line and a gate in the memory region and the logic circuitry region, respectively, and forming an LDD in the substrate beside the word line and a nitride spacer on a sidewall of the gate;

forming a buffer layer and an etching stop layer over the substrate successively;

forming a bit line and a capacitor in at least one dielectric layer in the memory region, such that the at least one dielectric layer also covers the logic circuitry region;

removing the at least one dielectric layer in the logic circuitry region to expose the etching stop layer;

removing the etching stop layer in the logic circuitry region to expose the buffer layer;

removing the buffer layer to expose the gate and the substrate;

performing an ion implantation to form a retrograde channel profile in the substrate to adjust a threshold voltage of the gate;

forming a source/drain region in the substrate beside the gate; and forming a salicide on the source/drain region.

2. The method according to claim 1, wherein the etching stop layer includes silicon nitride layer.

3. The method according to claim 1, wherein the buffer layer includes silicon oxide layer.

4. The method according to claim 1, wherein forming the retrograde channel profile in the substrate includes a high-energy through gate implantation.

5. A method of fabricating an embedded DRAM wherein a memory region and a logic circuitry region are defined on a substrate, comprising:

forming a word line and a gate in the memory region and the logic circuitry region, respectively, and forming a spacer on a sidewall of the gate;

forming an etching stop layer over the substrate;

forming a cell array including a bit line and a capacitor in the memory region such that the bit line and the capacitor are insulated and covered by a dielectric layer, and the dielectric layer also covers the logic circuitry region;

removing the dielectric layer in the logic circuitry region;

removing the etching stop layer in the logic circuitry region to expose the gate and the substrate;

forming a threshold adjust implantation in the substrate;

forming a source/drain region in the substrate beside the gate; and forming a salicide on the source/drain region.

6. The method according to claim 5, wherein the threshold adjust implantation is performed by high-energy implantation.

7. The method according to claim 5, wherein the threshold adjust implantation is performed through the gate.

8. The method according to claim 1, wherein the spacer includes silicon oxide layer.

9. The method according to claim 5, wherein the etching stop layer includes silicon nitride layer.

10. The method according to claim 5, wherein the step of removing the dielectric layer in the logic circuitry region includes wet etching.

11. The method according to claim 5, wherein the step of removing the etching stop layer in the logic circuitry region includes wet etching.

12. A method of fabricating an embedded DRAM wherein a memory region and a logic circuitry region are defined on a substrate, comprising:

forming a word line and a gate in the memory region and the logic circuitry region, respectively, and forming a spacer including silicon oxide on a sidewall of the gate;

forming an etching stop layer including silicon nitride over the substrate;

forming a cell array including a bit line and a capacitor in the memory region such that the bit line and the capacitor are insulated and covered by a dielectric layer, and the dielectric layer also covers the logic circuitry region;

removing the dielectric layer in the logic circuitry region;

removing the etching stop layer in the logic circuitry region to expose the gate and the substrate;

forming a threshold adjust implantation in the substrate;

forming a source/drain region in the substrate beside the gate; and forming a salicide on the source/drain region.

* * * * *